May 19, 1970 F. W. MILLARD 3,512,970

PHOTOPOLYMERIZATION

Filed June 21, 1966

INVENTOR
FREDERICK W. MILLARD

BY Walter G. Hensel

ATTORNEY

United States Patent Office 3,512,970
Patented May 19, 1970

3,512,970

PHOTOPOLYMERIZATION

Frederick W. Millard, Montrose, Pa., assignor to GAF Corporation, New York, N.Y., a corporation of Delaware Filed June 21, 1966, Ser. No. 559,204
Int. Cl. G03c 5/00, 5/24
U.S. Cl. 96—35.1 8 Claims

ABSTRACT OF THE DISCLOSURE

Production of a photographic image by image-wise irradiation of a photographic element having as its light-sensitive layer a hydrophilic colloid having therein a normally liquid to solid polymerizable monomer containing a $CH_2=C<$ group and a photoinitiating catalyst therefor, and developing by contacting the element with water vapor at 70–100° C. and a relative humidity of at least 70%.

Figure 1:
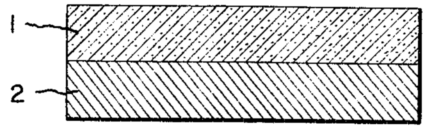

The present invention relates, in general, to photopolymerization and, in particular, to the image-wise photopolymerization of light-sensitive compositions containing one or more ethylenically unsaturated monomeric vinyl compounds according to a process which eliminates any requirement for solvent removal of non-polymerized areas for production of the polymeric image.

It is well known that certain ethylenically unsaturated organic compounds, more commonly referred to as vinyl monomers, when exposed to light undergo polymerization with the formation of hardened polymeric masses in accordance with the point to point intensity of the light pattern incident thereupon. Light-sensitive materials of this type have been utilized on a wide scale in photography as well as the related fields of photolithography for the production of polymeric photographic images, their use being extensively described in the published literature both patent and otherwise. According to conventional techniques, a light-sensitive layer containing at least one ethylenically unsaturated vinyl monomer is exposed to an optical image to effect polymerization in the irradiated areas. The layer thus exposed is thereafter developed and fixed by preferential dissolution of the unexposed, i.e., non-polymerized areas to provide the desired polymeric resist image.

Despite the widespread commercial acceptance of photopolymerization methods based essentially on the aforedescribed technique, certain disadvantages have nevertheless been encountered in its practice. Perhaps the paramount objection relates to the necessity of using costly solvents to remove the non-polymerized areas. The operations peculiar to solvent removal of non-polymerized areas can prove economically prohibitive both from the standpoint of time-consumption as well as materials-handling. Moreover, the solvents customarily employed, being organic materials, in many instances present serious problems relating to personal safety, e.g., toxicity, inflammability, etc. It therefore becomes incumbent upon practitioners of such methods to provide special equipment specifically adapted to the use of such solvent materials in order to reduce the risk to personnel to an absolute minimum. Furthermore, in view of the high cost of such materials, it becomes imperative, as a matter of economics, to use special techniques for solvent recovery, purification, etc. It is at once apparent that the manifold problems associated with the use of costly organic solvents tend to pose a serious deterrent to the exploitation of photopolymerization techniques requiring their use.

In an effort to overcome or otherwise alleviate the foregoing and related problems, the art has resorted to the use of polymerization processes wherein the volume requirements regarding the organic solvent materials are reduced to an extent consonant with the requirements of quality image reproduction. Despite the realization of some margin of success, the alternative techniques heretofore evolved have nevertheless been characterized by a number of significant drawbacks which, in the main, relate to the quality of the resist image obtained. More specifically, such images are usually of inferior quality being ill-defined. More importantly, they do not lend themselves to extensive repetitive use thereby increasing the overall costs involved.

In accordance with the discovery forming the basis of the present invention, it has been ascertained that the production of polymeric images based upon the use of conventional photopolymerizable compositions, i.e., those containing a hydrophilic polymeric binder, vinyl monomer and photo-initiating catalyst, can be achieved according to a process which is totally devoid of any requirement for the solvent removal of non-polymerized areas.

Thus, a primary object of the present invention resides in the provision of a photopolymerization process wherein the above and related disadvantages are eliminated or at least mitigated to a substantial extent.

Another object of the present invention resides in the provision of a photopolymerization process which eliminates any need for the use of organic solvents in the development of the polymeric image and thus obviates any necessity for the use of special equipment, solvent recovery operations, etc.

A further object of the present invention resides in the provision of a photopolymerization process which provides a polymeric image characterized by superior reproduction quality, i.e., image resolution, image stability and the like.

A still further object of the present invention resides in the provision of a photopolymerization process which can be readily implemented with the use of relatively simple and economical facilties.

Other objects and advantages of the present invention will become apparent hereinafter as the description proceeds.

The attainment of the foregoing and related objects is made possible in accordance with the present invention which provides a process for the imagewise photopolymerization of ethylenically unsaturated vinyl monomers homogeneously dispersed throughout a hydrophilic polymeric binder in the presence of a photo initiating catalyst wherein the developing operation consists solely in subjecting the monomer layer immediately following actinic exposure to a humid environment, i.e., atmosphere of water vapor, of at least 75% relative humidity at a temperature ranging from about 70° C. to about 100° C. The term relative humidity is used herein in its conventional sense and connotes the weight of water vapor, expressed as a percentage, contained in a given volume of air divided by the weight which would be contained in the same volume of saturated air at the same temperature.

Specifically, it has been determined that when a photopolymerizable element comprising a suitable base coated with a composition containing a hydrophilic polymeric binder, an ethylenically unsaturated vinyl monomer and a photoinitiator is given an image-wise exposure and then subjected to an atmosphere of water vapor, e.g., steam, under the conditions described above, the exposed, i.e., polymerized areas, undergo an image-wise volume decrease, i.e., contraction in proportion to the intensity of the exposure received thereby producing a sharp intaglio image. This recessed image is readily discernible to the naked eye and can be readily projected by means of conventional optic systems, e.g., schlieren. The contacting of the exposed element with a humid atmosphere necessary for development can be readily accomplished in a number of ways. For example, following exposure the photopolymerizable element may be inserted into a closed container maintained under the proper conditions of humidity and temperature. Alternatively, the monomer layer may be sprayed directly with e.g., a steam hose in such manner that the surface regions of the monomer layer are subjected to the humidity and temperature conditions required for development. Quite obviously, any number of techniques may be devised for such purposes. Regardless of the particular method employed, however, it will be recognized that the system may be easily adapted to continuous processing.

The image resolution obtainable by the process of the present invention is exceptional which is, of course, of paramount importance. In this connection the image bearing layers obtainable herein are capable of resolving 100 lines/mm. and are thus admirably suited for most commercial applications. The intaglio plates produced by the present process are uniquely advantageous in that they are capable of receiving a plurality of images, i.e., if protected from light, can be utilized for sequential exposure without loss in response, i.e., sensitivity in the unexposed areas after drying. Quite obviously, if the printing plate is to be subjected to plural exposures, it is imperative that it be stored during periods of non-use under conditions, i.e., in terms of relative humidity, temperature, etc., which would militate against any possibility of inadvertent polymerization. This can be readily achieved by merely storing the plate under conditions of moderate temperature and relative humidity. As will be recognized, apart from the aforementioned restrictions regarding the conditions of plate storage, additional precautions are unnecessary, i.e., further fixation following development with water vapor is not required.

The mechanism by which the process of the present invention functions has not been definitely ascertained and is not self-evident. Nevertheless, and without intending to be bound by any theory, it has been postulated in explanation thereof that the photolytically induced conversion of monomer to polymer in the light struck areas of the photopolymerizable layer results in a strained condition in the polymer molecules present thereat. The subjection of such areas to a humid environment under the aforedescribed conditions causes such polymerized areas to undergo contraction. The net result is an image-wise contraction of the polymer layer to provide an intaglio plate. The tendency of vinyl monomers to assume a strained condition when converted to polymers is well established to the extent that the contraction phenomena observed to attend the conversion of monomers to polymers with moisture has been extensively employed as an analytical method to measure the rate of conversion of monomer to polymer by conventional dilatometry.

Figure 2:
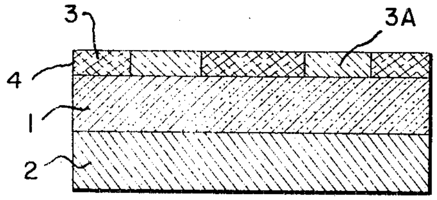
Figure 3:
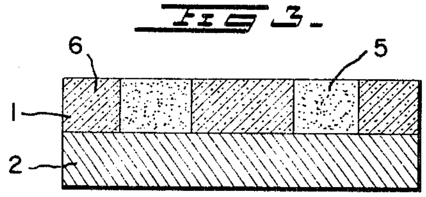
Figure 4:
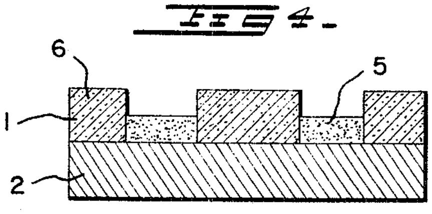

The process of the present invention can perhaps be best understood by reference to the accompanying drawing. In FIG. 1, 2 represents a suitable support overcoated with 1, a polymerizable monomer layer. FIG. 2 depicts the exposure step wherein a suitable photographic negative or positive is placed in contact with the polymerizable monomer layer and the assembly thereafter irradiated with actinic radiation. The photgraphic negative or positive 4 contains image areas 3 and non-image areas 3A. FIG. 3 illustrates the photopolymerizable element immediately following exposure with the polymer areas represented at 5 and the non-polymerized areas represented at 6. FIG. 4 illustrates the photopolymerizable element following steam development with image areas 5 being depicted in contracted form.

As mentioned hereinbefore, the process of the present invention can be advantageously utilized with any of the photopolymerizable compositions heretofore provided in the art. Customarily, such compositions include as essential ingredients at least one polymerizable vinyl monomer, a hydrophilic polymeric binder colloid and a photoinitiating catalyst. It should be emphasized that the process described herein in no way depends for operability upon the nature of the particular components selected, i.e., monomer, catalyst, etc., apart from the one requirement that representative species of each of such ingredients be present.

Thus, any normally liquid to solid photopolymerizable unsaturated organic compound is suitable in the practice of this invention. Preferably, such compounds should be ethylenically unsaturated, i.e., contain at least one non-aromatic double bond between adjacent carbon atoms. Compounds particularly advantageous are the photopolymerizable vinyl or vinylidene compounds containing a $CH_2{=}C<$ group activated by direct attachment to an electro-negative group such as halogen, $C{=}O$, $—C{\equiv}N$, $—C{\equiv}C$, $—O—$. Examples of such photopolymerizable unsaturated organic compounds include acrylamide, acrylonitrile, N-ethanol-acrylamide, methacrylic acid, acrylic acid, calcium acrylate, methacrylamide, vinyl acetate, methyl methacrylate, methyl acrylate, N,N′-methylene bisacrylamide, ethyl acrylate, vinyl benzoate, vinyl pyrrolidone, ether, vinyl butyl ether, vinyl isopropyl ether, vinyl isobutyl ether, vinyl butyrate, or mixtures of ethyl acrylate with vinyl acetate, acrylonitrile with styrene, and the like.

The above ethylenically unsaturated organic compounds, or vinyl monomers as they are sometimes called, may be used either alone or in admixture in order to vary the physical properties such as molecular weight, hardness, etc. of the final polymer. Thus, it is a recognized practice, in order to produce a vinyl polymer of the desired physical properties, to polymerize in the presence of a small amount of an unsaturated compound containing at least two terminal vinyl groups each linked to a carbon atom in a straight chain or in a ring. The function of such compounds is to cross-link the polyvinyl chains. This technique, as used in polymerization, is further described by Kropa and Bradley in vol. 31, No. 12, of Industrial and Engineering Chemistry, 1939. Among such cross-linking agents for the purpose described herein may be mentioned N,N′-methylene-bis-acrylamide, triallyl cyanurate, divinyl benzene, divinyl ketones and alkylene and dialkylene glycol diacrylates and dimethylacrylates as illustrated by ethyleneglycol diacrylate. Generally speaking, increasing the quantity of cross-linking agents increases the hardness of the polymer obtained in the range wherein the ratio of monomer to cross-linking agent varies from 10:1 to 50:1.

The hydrophilic polymeric binder employed may be selected from a wide variety of materials well known in the photopolymerization art. Particularly beneficial results are obtained with e.g., gelatin, polyvinyl alcohol, casein, glue, saponified cellulose acetate, carboxymethyl cellulose, starch, vinyl alkyl ether maleic anhydride copolymers and the like. The proportion of hydrophilic polymeric binder employed will ordinarily range from about 3 to about 30 parts by weight of monomer per 100 parts by weight of binder with a range of 10 parts to 20 parts of monomer per 100 parts of binder being particularly preferred.

The photoinitiators suitable for use herein encompass a broad range of materials and may be selected from any of those conventionally employed in the art in photopolymerizable compositions. Again, little in the way of criticality attaches to the selection of a particular catalyst material, the sole requirement with respect thereto being that they be capable of initiating the polymerization of vinyl-monomers of the type described herein under the influence of actinic radiation. Thus, suitable catalysts include, without limitation, ferric ammonium citrate, sodium perborate, alkali metal or ammonium persulfate, ceric ammonium nitrate, cumene hydroperoxide, uranyl salts, e.g., uranyl acetate, riboflavin-5'-phosphate sodium which may be utilized alone or in admixture. Other suitable catalysts include the silver compounds described in U.S. Pat. 3,050,390, the diazonium compounds in U.S. Pat. 3,099,558, etc.

The amount of catalyst employed will ordinarily range from about 0.2 to about 10 parts by weight per 100 parts of monomer with a range of 1 to 5 parts being particularly preferred.

It will be understood that the photopolymerizable compositions constituted as described above may further contain one or more additional adjuvants for purposes of expediting the coating operation, promoting stability and the like. Thus, there may be added diluents, surface active agents, viscosity stabilizers and the like. Such addenda are well known in the art and a detailed discussion with respect thereto would not be necessary.

The material employed as the support for the photopolymerizable composition may be any of those utilized in the art for such purposes. Representative materials in this regard include, without limitation, paper, metal such as aluminum sheets which may be anodized or treated with sodium phosphate, sodium silicate and the like, polymeric materials, e.g., saponified cellulose acetate, cellulose acetate butyrate, etc., film-forming synthetic resinous materials such as polystyrene, polycarbonate, polyesters, copolymers of vinyl chloride and vinyl acetate, rubber mollified polystyrene and the like.

The photopolymerization may be effected by irradiation of the polymerizable monomer layer with radiation ranging from $10^{-4}$ to $10^{-10}$ cm., i.e., electromagnetic radiation having a wave length ranging from the utraviolet to the visible region of the spectrum. However, since photopolmerization may be readily effected with visible light, it is preferable that such radiation be employed. As is well known, sensitivity to the visible region of the spectrum may be readily imparted to the photopolymerizable compositions contemplated for use herein by the addition thereto of one or more sensitizing dyes.

The photopolymerization process described herein may be employed in numerous modifications and ramifications. Such a system is particularly applicable to image-wise polymerization as exemplified in the production of intaglio printing plates for use in the graphic arts. A still further photographic application of the process described herein relates to color reproduction. For example, the light sensitive plate prepared as described herein, i.e., a base coated with polymerizable vinyl monomer and photoinitiating catalyst dispersed throughout a hydrophilic polymeric binder colloid is exposed to one of the primary color aspects of a subject as represented by a color separation negative. After subjecting the exposed element to the humid environment necessary for development, i.e., polymer contraction, the recessed image areas are provided with a suitable greasy ink, its color being complementary in hue to the color represented by the image areas of the separation negative. At this point, one of the truly outstanding features of the present invention is readily manifest.

As indicated hereinbefore, the printing plate obtained is rather uniquely atypical in that it may be utilized for recording additional images. Thus, whereas the use of prior art techniques would in most instances require that a separate photopolymerizable element be employed for recording further color aspects of the color negative or positive being reproduced, the intaglio plate produced as described herein is eminently adapted for recording all of the color aspects. This, of course, presents a distinct economic advantage from the standpoint of printing plate cost as well as handling.

The time required for development of the polymeric image, i.e., the dwell time of the exposed photopolymerizable element in the humid environment will ordinarily range from about 0.1 second to about 15 seconds. The actual contacting time required will depend for the most part upon the conditions of development, i.e., relative humidity and temperature. In most instances, satisfactory development can be achieved by merely instantaneous contacting of the photopolymerizable element with the humid atmosphere, e.g., steam. This will usually be sufficient to effect the necessary degree of contraction in the polymeric image areas, i.e., to an extent wherein the maximum contraction amounts to approximately 30% of the initial coating thickness, this being verified by microscopic examination of the printing plate cross section.

The following examples are given for purposes of illustrating the present invention in greater detail and are not to be considered as being limitative thereof.

EXAMPLE 1

A photopolymerizable composition is prepared comprising:

7.5 g. gelatin
50 ml. water
0.75 g. N,N'-methylenebisacrylamide
10 ml. 36% ferric ammonium citrate, brown form
0.5 ml. 8% saponine Approximately 0.5 ml. of cumene hydroperoxide is dispersed in the above solution with a Waring Blendor. The dispersed formulation was then coated on a cellulose acetate butyrate film base. Following exposure through a photographic negative for 15 seconds using a 375 watt medium beam photoflood at 15 inches, brief contact with an atmosphere of steam from 1 to 5 seconds produced a sharp polymeric intaglio image.

EXAMPLE 2

The procedure was the same as in Example 1, except that instead of gelatin, 2% carboxymethyl cellulose was used as the binder (cellulose gum 7–C available commercially from the Hercules Powder Co.). A sharp polymeric intaglio image was obtained.

EXAMPLE 3

The procedure was the same as in Example 1, except that 3 g. of a copolymer of maleic anhydride and methyl vinyl ether (Gantrez AN–139, available commercially from the General Aniline and Film Corp.) was used as the binder instead of gelatin. Again, a sharp polymeric intaglio image was obtained.

EXAMPLE 4

A photopolymerizable composition is prepared comprising:

7.5 g. photographic gelatin
50 ml. water
14 ml. 0.01 M ceric ammonium nitrate
3.5 ml. 10% oxalic acid
29 ml. 4% aqueous N,N'-methylenebisacrylamide
1 ml. 8% saponine
4 ml. polyethylene glycol (Carbowax 600, available commercially from the Union Carbide Co.).

The above composition is coated on a cellulose acetate film base and exposed for 15 seconds to a photoflood at 15 inches. The exposed element was then contacted with an atmosphere of steam for 1 to 5 seconds whereupon there was obtained a sharp polymeric intaglio image.

EXAMPLE 5

A photopolymerizable composition is prepared comprising:

5 g. photographic gelatin
50 ml. water
0.8 g. N,N'-methylenebisacrylamide
1 ml. 1% riboflavin-5'-phosphate sodium
1 ml. 8% saponine The above composition was coated on a cellulose acetate film base and exposed for about 30 seconds to a photoflood at 15 inches. Development was instantaneous upon development with steam under the conditions of Example 4.

EXAMPLE 6

A photopolymerizable composition is prepared comprising:

7.5 g. photographic gelatin
45 ml. water
1 g. acrylamide
10 ml. 36% ferric ammonium citrate
0.5 ml. cumene hydroperoxide
1 ml. 8% saponine The above formulation was coated on a cellulose acetate butyrate film base. Exposure for 15 seconds followed by steam development in the manner of example A produced a sharp polymeric recessed image.

EXAMPLE 7

The procedure was the same as in Example 6, except that 1 g. of calcium acrylate was substituted for the acrylamide. Again, a sharply defined polymeric intaglio image was obtained.

EXAMPLE 8

The procedure was the same as in Example 7 except that the acrylamide was replaced by 1 g. of methacrylamide. Similar results were obtained.

EXAMPLE 9

A photopolymerizable composition is prepared comprising:

5 g. photographic gelatin
50 ml. water
1 g. N,N'-methylenebisacrylamide
8 ml. 8% aqueous uranyl acetate
1 ml. 8% saponine The above formulation was coated on a cellulose acetate film phase and exposed for 1 minute followed by contact with steam for 1 to 5 seconds gave a sharp polymeric intaglio image.

Results similar to those described in the above examples are obtained when the procedures therein are repeated but employing in lieu of the specific monomers exemplified, the following materials:

Acrylonitrile
N-methylol acrylamide
Vinyl acetate
Vinyl butyrate

The present invention has been disclosed with respect to certain preferred embodiments thereof, and there will become obvious to persons skilled in the art various modifications, equivalents or variations thereof which are intended to be included within the spirit and scope of this invention.

What is claimed is:

1. A process of producing by photopolymerization a polymeric photographic image which comprises irradiating with electromagnetic radiation having a wave length extending from the ultra-violet through the visible region a photographic element comprising a support having thereon a radiation sensitive layer comprising a normally liquid to normally solid monomer containing the grouping:

$$CH_2{=}C<$$

attached directly to an electronegative group, a hydrophilic polymeric colloid carrier therefor and a photoinitiating catalyst thereby effecting polymerization of monomer in the irradiated areas and thereafter developing said monomer layer by contacting same with a water-vapor environment of at least 75% relative humidity at a temperature ranging from 70° C. to 100° C.

2. A process according to claim 1 wherein said monomer comprises N,N'-methylenebisacrylamide.

3. A process according to claim 1 wherein said monomer comprises acrylamide.

4. A process according to claim 1 wherein said monomer comprises methacrylamide.

5. A process according to claim 1 wherein said monomer comprises calcium acrylate.

6. A process according to claim 1 wherein said colloid carrier comprises gelatin.

7. A process according to claim 1 wherein said colloid carrier comprises carboxymethyl cellulose.

8. A process according to claim 1 wherein said colloid carrier comprises a co-polymer of maleic anhydride and methyl vinyl ether.

References Cited

UNITED STATES PATENTS

| | | | |
|---|---|---|---|
| 1,547,446 | 7/1925 | Renck | 96—35 |
| 2,709,654 | 5/1955 | Guth | 96—35 |
| 3,061,431 | 10/1962 | Levinos | 96—35.1 |
| 3,352,675 | 11/1967 | Cerwonka | 96—35.1 |

DONALD LEVY, Primary Examiner

R. E. MARTIN, Assistant Examiner

U.S. Cl. X.R.

96—48

Disclaimer 3,512,970.—*Frederick W. Millard,* Montrose, Pa. PHOTOPOLYMERIZATION. Patent dated May 19, 1970. Disclaimer filed Sept. 30, 1982, by the assignee, *Eastman Kodak Co.*

Hereby enters this disclaimer to all claims of said patent.

[*Official Gazette March 22, 1983.*]